United States Patent
Hashemi et al.

(10) Patent No.: US 10,944,044 B2
(45) Date of Patent: Mar. 9, 2021

(54) MRAM STRUCTURE WITH T-SHAPED BOTTOM ELECTRODE TO OVERCOME GALVANIC EFFECT

(71) Applicant: International Business Machines Corporation, Armonk, NY (US)

(72) Inventors: Pouya Hashemi, Purchase, NY (US); Bruce B. Doris, Slingerlands, NY (US); Eugene J. O'Sullivan, Nyack, NY (US); Michael F. Lofaro, Brookfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/534,609

(22) Filed: Aug. 7, 2019

(65) Prior Publication Data
US 2021/0043827 A1 Feb. 11, 2021

(51) Int. Cl.
*H01L 43/08* (2006.01)
*H01L 43/02* (2006.01)
*H01L 27/22* (2006.01)
*H01L 43/12* (2006.01)

(52) U.S. Cl.
CPC ............ *H01L 43/02* (2013.01); *H01L 27/222* (2013.01); *H01L 43/12* (2013.01)

(58) Field of Classification Search
CPC ....... H01L 27/222; H01L 43/02; H01L 43/08; H01L 43/12
See application file for complete search history.

(56) References Cited

U.S. PATENT DOCUMENTS

| | | | |
|---|---|---|---|
| 6,943,420 B2 | 9/2005 | Jeong | |
| 9,564,577 B1 | 2/2017 | Hsu et al. | |
| 9,666,790 B2 | 5/2017 | Chuang et al. | |
| 9,735,351 B2 | 8/2017 | Lee et al. | |
| 9,818,935 B2 | 11/2017 | Chuang et al. | |
| 10,069,064 B1 | 9/2018 | Haq et al. | |
| 2007/0187785 A1* | 8/2007 | Hung ...................... H01L 43/12 257/421 |
| 2016/0268499 A1 | 9/2016 | You et al. | |
| 2017/0084819 A1 | 3/2017 | Lu et al. | |
| 2018/0097173 A1 | 4/2018 | Chuang et al. | |
| 2018/0375024 A1* | 12/2018 | Chu ...................... H01L 45/146 |

(Continued)

FOREIGN PATENT DOCUMENTS

| | | |
|---|---|---|
| CN | 108232009 A | 6/2018 |
| CN | 108735896 A | 11/2018 |
| CN | 108878471 A | 11/2018 |

OTHER PUBLICATIONS

International Search Report dated Oct. 15, 2020 received in a corresponding foreign application, 9 pages.

*Primary Examiner* — Cheung Lee
(74) *Attorney, Agent, or Firm* — Scully, Scott, Murphy & Presser, P C.; Daniel P. Morris, Esq.

(57) ABSTRACT

A memory structure is provided that avoids high resistance due to the galvanic effect. The high resistance is reduced and/or eliminated by providing a T-shaped bottom electrode structure of uniform construction (i.e., a single piece). The T-shaped bottom electrode structure includes a narrow base portion and a wider shelf portion. The shelf portion of the T-shaped bottom electrode structure has a planar topmost surface in which a MTJ pillar forms an interface with.

24 Claims, 13 Drawing Sheets

(56) References Cited

U.S. PATENT DOCUMENTS

| | | |
|---|---|---|
| 2019/0066746 A1 | 2/2019 | Li et al. |
| 2019/0140169 A1 | 5/2019 | Hsu et al. |
| 2020/0127053 A1* | 4/2020 | Chen .................. H01L 45/16 |
| 2020/0127189 A1* | 4/2020 | Liao ................ H01L 45/1675 |

* cited by examiner

US 10,944,044 B2

MRAM STRUCTURE WITH T-SHAPED BOTTOM ELECTRODE TO OVERCOME GALVANIC EFFECT

BACKGROUND

The present application relates to a memory structure and a method of forming the same. More particularly, the present application relates to a magnetoresistive random access memory (MRAM) structure which contains a T-shaped bottom electrode structure that avoids high resistance due to the galvanic effect.

MRAM is a viable memory option for stand alone and embedded applications such as, for example, Internet of things (IoT), automobile, or artificial intelligence (AI). MRAM is a non-volatile random access memory technology in which data is stored by magnetic storage elements. These elements are typically formed from two ferromagnetic plates, each of which can hold a magnetization, separated by a thin dielectric layer, i.e., the tunnel barrier layer. One of the two plates is a permanent magnetic set to a particular polarity; the other plate's magnetization can be changed to match that of an external field to store memory. The permanent magnet can be referred to as a magnetic pinned or reference layer, and the magnet that changes magnetization to match that of an external field can be referred to as a magnetic free layer. Collectively, the magnetic pinned layer, the tunnel barrier layer and the magnetic free layer provide a multilayered magnetic tunnel junction (MTJ) pillar.

The MTJ pillar is formed on a bottom electrode. The size of the bottom electrode plays a significant role on array yield loss due to partial metallic shorts, especially when the MTJ size is reduced to increase switching efficiency. Typically, a small sized bottom electrode is desired.

In addition, conventional bottom electrodes in MRAM structures are composed of a metal such as, for example, TiN or Cu, that can be prone to a so-called galvanic effect during a chemical mechanical planarization process that is used to form the bottom electrode. It is noted that the galvanic effect is observed when a bottom electrode is formed upon an electrically conductive structure that is connected to a complementary metal oxide semiconductor (CMOS) device; for a bottom electrode that is formed on an electrically conductive structure that is isolated from a CMOS device, the galvanic effect is not observed. The galvanic effect results in unwanted oxidation and/or corrosion of the bottom electrode which can lead to high resistance and array yield loss. There is thus a need to provide a memory structure (i.e., a MRAM structure) in which the galvanic effect is reduced or even eliminated.

SUMMARY

A memory structure is provided that avoids high resistance due to the galvanic effect. The high resistance is reduced and/or eliminated by providing a T-shaped bottom electrode structure of uniform construction (i.e., a single piece). The T-shaped bottom electrode structure includes a narrow base portion and a wider shelf portion. The shelf portion of the T-shaped bottom electrode structure has a planar topmost surface in which a MTJ pillar forms an interface with.

In one aspect of the present application, a memory structure is provided. In one embodiment, the memory structure includes a T-shaped bottom electrode structure of uniform construction located on a surface of a complementary metal oxide semiconductor (CMOS) device connected electrically conductive structure that is embedded in a first interconnect dielectric material layer. A multilayered magnetic tunnel junction (MTJ) pillar is located on the T-shaped bottom electrode structure, and a top electrode structure is located on the MTJ pillar.

The MTJ pillar that can be used in the present application can be a bottom pinned MTJ material structure or a top pinned MTJ material structure. The T-shaped bottom electrode structure of the present application includes a base portion and a shelf portion, the shelf portion has a width that is greater than a width of the base portion. In some embodiments, a second interconnect dielectric material layer can laterally surround the base portion of the T-shaped bottom electrode structure and is located above the first interconnect dielectric material layer. In some embodiments, a diffusion barrier liner can be located directly beneath the shelf portion of T-shaped bottom electrode structure, and lining the sidewalls and bottom wall of the base portion of the T-shaped bottom electrode structure.

In some embodiments, an encapsulation liner and a third interconnect dielectric material layer can be located laterally adjacent to the shelf portion of the T-shaped bottom electrode structure, the MTJ pillar and the top electrode structure. In further embodiments, a bitline contact can be located on the third interconnect dielectric material layer and contacting a surface of the top electrode structure.

In another aspect of the present application, a structure is provided. In one embodiment, the structure includes a first memory cell that includes a first T-shaped bottom electrode structure of uniform construction located on a surface of a complementary metal oxide semiconductor (CMOS) device connected electrically conductive structure that is embedded in a first interconnect dielectric material layer, a first multilayered magnetic tunnel junction (MTJ) pillar located on the first T-shaped bottom electrode structure, and a first top electrode structure located on the first MTJ pillar. The structure further includes a second memory cell located laterally adjacent to the first memory cell. The second memory cell includes a second T-shaped bottom electrode structure of uniform construction located on a surface of an isolated electrically conductive structure that is embedded in the first interconnect dielectric material layer, a second MTJ pillar located on the second T-shaped bottom electrode structure, and a second top electrode structure located on the second MTJ pillar.

The first MTJ pillar and the second MTJ pillar can be a bottom pinned MTJ material structure or a top pinned MTJ material structure. In some embodiments, the first T-shaped bottom electrode structure and the second T-shaped bottom electrode structure include a base portion and a shelf portion, the shelf portion has a width that is greater than a width of the base portion. In some embodiments, a second interconnect dielectric material layer can laterally surround the base portion of each of the first T-shaped bottom electrode structure and the second T-shaped bottom electrode structure and is located above the first interconnect dielectric material layer. In further embodiments, a diffusion barrier liner can be located directly beneath the shelf portion of each of the first T-shaped bottom electrode structure and the second T-shaped bottom electrode structure, and lining the sidewalls and bottom wall of the base portion of each of the first T-shaped bottom electrode structure and the second T-shaped bottom electrode structure.

In some embodiments, an encapsulation liner and a third interconnect dielectric material layer can be located laterally adjacent to the shelf portion of each of the first T-shaped bottom electrode structure and the second T-shaped bottom electrode structure, each of the first MTJ pillar and the second MTJ pillar, and each of the first top electrode structure and the second top electrode structure. In further embodiments, a bitline contact can be located on the third interconnect dielectric material layer and contacting a surface of the first top electrode structure and the second top electrode structure.

In a further aspect of the present application, a method of forming a memory structure is provided. In one embodiment, the method includes forming a second interconnect dielectric material layer on an interconnect level including at least one CMOS device connected electrically conductive structure embedded in a first interconnect dielectric material layer. At least one opening is then formed into the second interconnect dielectric material layer, wherein the at least one opening physically exposes a surface of the at least one CMOS device connected electrically conductive structure. Next, a bottom electrode metal-containing layer is formed on the second interconnect dielectric material layer and within the at least one opening. First and second planarization steps are then performed on the bottom electrode metal-containing layer to provide a twice planarized bottom electrode metal-containing layer. A multilayered magnetic tunnel junction (MTJ) material stack is formed on the twice planarized bottom electrode metal-containing layer, and a top electrode metal-containing layer is then formed on the MTJ material stack. Next, the top electrode metal-containing layer, the MTJ material stack and the twice planarized bottom electrode metal-containing layer are patterned to provide a top electrode structure, a MTJ pillar, and a T-shaped bottom electrode structure, respectively.

In some embodiments, the MTJ material stack includes a bottom pinned MTJ material stack or a top pinned MTJ material stack. In some embodiments, the T-shaped bottom electrode structure is of unitary construction and includes a base portion and a shelf portion, the shelf portion has a width that is greater than a width of the base portion. In some embodiments, an encapsulation liner, a third interconnect dielectric material layer, and a bitline contact can be formed after the patterning step. In some embodiments, the patterning can also remove an upper portion of the first interconnect dielectric material layer to provide a concave surface to the first dielectric material layer.

In some embodiments, and prior to forming the bottom electrode metal-containing layer, a diffusion barrier material layer is formed on the second interconnect dielectric material layer and lining the at least one opening. In some embodiments, the patterning also provides a diffusion barrier liner located beneath the T-shaped bottom electrode structure. In some embodiments and after the patterning step, an encapsulation liner, a third interconnect dielectric material layer, and a bitline contact are formed.

DETAILED DESCRIPTION

Figure 1:
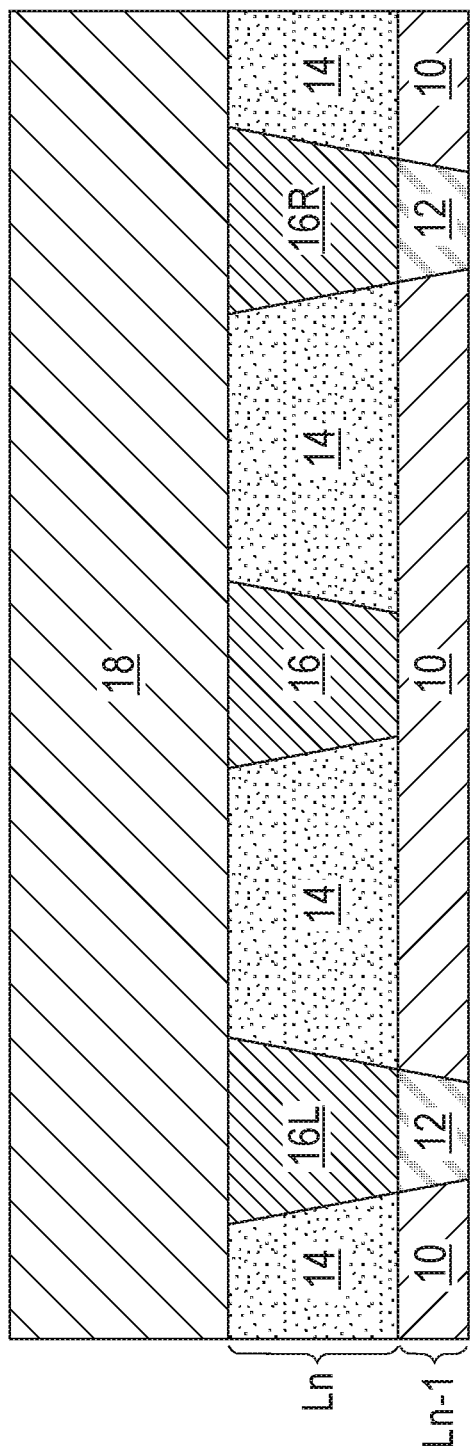
FIG. 1 is a cross sectional view of an exemplary structure that can be employed in one embodiment of the present application, the exemplary structure includes a second interconnect dielectric material layer located on an interconnect level including at least one CMOS device connected electrically conductive structure embedded in a first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It is noted that the drawings of the present application illustrate a memory device area in which a memory device such as, for example, a MRAM device, will be formed. A non-memory device area may be located laterally adjacent to the memory device area illustrated in the drawings of the present application.

Referring first to FIG. 1, there is illustrated an exemplary structure that can be employed in one embodiment of the present application. The exemplary structure of FIG. 1 includes a second interconnect dielectric material layer 18 located on an interconnect level, $L_n$ wherein n is an integer starting at 1. Interconnect level, $L_n$, includes at least one CMOS device connected electrically conductive structure 16L, 16R embedded in a first interconnect dielectric material layer 14. Interconnect level, $L_n$, may also include at least one isolated electrically conductive structure 16 embedded in the first interconnect dielectric material layer 14.

As is further shown in FIG. 1, metal level, $L_{n-1}$, is located beneath interconnect level, $L_n$. In some embodiments, and when n is 1, metal level, $L_{n-1}$, is a middle-of-the-line (MOL) level. In other embodiments, and when n is 2, 3, 4, etc, metal level, $L_{n-1}$, is a lower interconnect level that is positioned beneath interconnect level, $L_n$. In either embodiment, metal level, $L_{n-1}$, includes dielectric material layer 10 that contains at least one metal level electrically conductive structure 12 embedded therein that is connected, either directly or indirectly, to an underlying CMOS device (not shown) that is present in a front-end-of-the-line (FEOL) level (also not shown).

When n is 1, the dielectric material layer 10 of metal level, $L_{n-1}$, can be composed of a MOL dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants expressed herein are measured in a vacuum). Also, and in such an embodiment (i.e., when n is 1), the at least one metal level electrically conductive structure 12 is a contact structure that includes a contact metal or a contact metal alloy such as, for example, tungsten (W), cobalt (Co), platinum (Pt), nickel (Ni) or alloys thereof.

When n is greater than 1, the dielectric material layer 10 of metal level, $L_{n-1}$, can be composed of an interconnect dielectric material such as, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Also, and in such an embodiment (i.e., when n is greater than 1), the at least one metal level electrically conductive structure 12 is composed of an electrically conductive metal or an electrically conductive metal alloy. Examples of electrically conductive materials that can be used in the present application include copper (Cu), aluminum (Al), or tungsten (W), while an example of an electrically conductive metal alloy is a Cu—Al alloy.

The first interconnect dielectric material layer 14 of interconnect level, $L_n$, can be composed of one of the interconnect dielectric materials mentioned above for dielectric material layer 10. The at least one CMOS device connected electrically conductive structure 16L, 16R and, if present, the at least one isolated electrically conductive structure 16 that are embedded in the first interconnect dielectric material layer 14 can be composed of one of the electrically conductive metals or metal alloys mentioned above for the at least one metal level electrically conductive structure 12.

In some embodiments, a diffusion barrier liner (not shown) is formed along the sidewall and a bottom wall of the at least one metal level electrically conductive structure 12 and/or the at least one CMOS device connected electrically conductive structure 16L, 16R and/or the at least one isolated electrically conductive structure 16. In some embodiments and as illustrated in FIG. 1, no diffusion barrier liner(s) is(are) present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material can include a material stack of diffusion barrier materials. In one example, the diffusion barrier material can be composed of a stack of Ta/TaN.

Metal level, $L_{n-1}$, and interconnect level, $L_n$, can be formed utilizing conventional processes that are well-known to those skilled in the art. So as to not obscure the method of the present application, the techniques used to form metal level, $L_{n-1}$, and interconnect level, $L_n$, are not provided herein. In one embodiment, a damascene process can be used in forming both metal level, $L_{n-1}$, and interconnect level, $L_n$. A damascene process can include forming an opening into a dielectric material, filling the opening with a either a contact-metal containing material or an electrically conductive metal-containing material and, if needed, performing a planarization process such as, for example, chemical mechanical polishing (CMP) and/or grinding.

In some embodiments, the at least one metal level electrically conductive structure 12 has a topmost surface that is coplanar with a topmost surface of dielectric material layer 10, and the least one CMOS device connected electrically conductive structure 16L, 16R and, if present, the at least one isolated electrically conductive structure 16 have a topmost surface that is coplanar with a topmost surface of the first interconnect dielectric material layer 14.

After forming interconnect level, $L_n$, the second interconnect dielectric material layer 18 is formed on the physically exposed topmost surface of interconnect level, $L_n$. The second interconnect dielectric material layer 18 can be composed of one of the interconnect dielectric materials mentioned above for dielectric material layer 10. In some embodiments, the second interconnect dielectric material layer 18 is composed of an interconnect material that is compositionally the same as the interconnect dielectric material that provides the first interconnect dielectric material layer 14. In other embodiments, the second interconnect dielectric material layer 18 is composed of an interconnect material that is compositionally different from the interconnect dielectric material that provides the first interconnect dielectric material layer 14. The second interconnect dielectric material layer 18 is a continuous layer that can be formed utilizing a conventional deposition process such as, for example, chemical vapor deposition (CVD), plasma enhanced chemical vapor deposition (PECVD), chemical solution deposition, evaporation, or atomic layer deposition (ALD). In one embodiment, the second interconnect dielectric material layer 18 can have a thickness (i.e., vertical height) from 50 nm to 200 nm. The thickness of the interconnect dielectric material layer 18 will determine the height of the base portion of the T-shaped bottom electrode structure to be subsequently formed.

Figure 2:
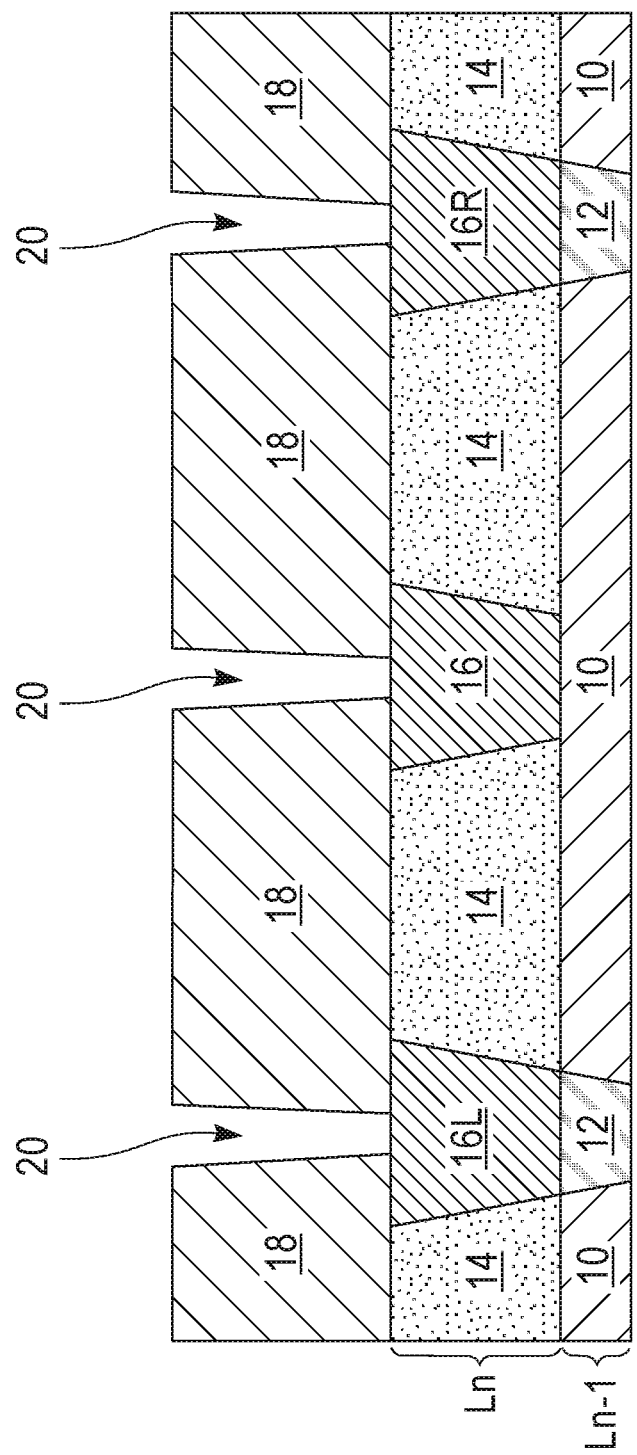
FIG. 2 is a cross sectional view of the exemplary structure of FIG. 1 after forming at least one opening into the second interconnect dielectric material layer, wherein the at least one opening physically exposes a surface of the at least one CMOS device connected electrically conductive structure.

Referring now to FIG. 2, there is illustrated the exemplary structure of FIG. 1 after forming at least one opening 20 into the second interconnect dielectric material layer 18, wherein the at least one opening 20 physically exposes a surface of the at least one CMOS device connected electrically conductive structure 16L, 16R. In some embodiments in which an isolated electrically conductive structure 16 is present, another opening 20 can also formed in the first interconnect dielectric material layer 14 that physically exposes a surface of the at least one isolated electrically conductive structure 16.

Each opening 20 can be formed into the second interconnect dielectric material layer 18 by lithography and etching. Lithography includes forming a photoresist material on a material or material stack that needs to be patterned, exposing the photoresist material to a predetermined pattern of irradiation and developing the exposed photoresist to provide a patterned photoresist. Etching may include an anisotropic etching process such as, for example, reactive ion etching (RIE). Each opening 20 can have a width from 5 nm to 100 nm. The width of each opening 20 will determine the width of base portion of the T-shaped bottom electrode structure to be subsequently formed.

Figure 3:
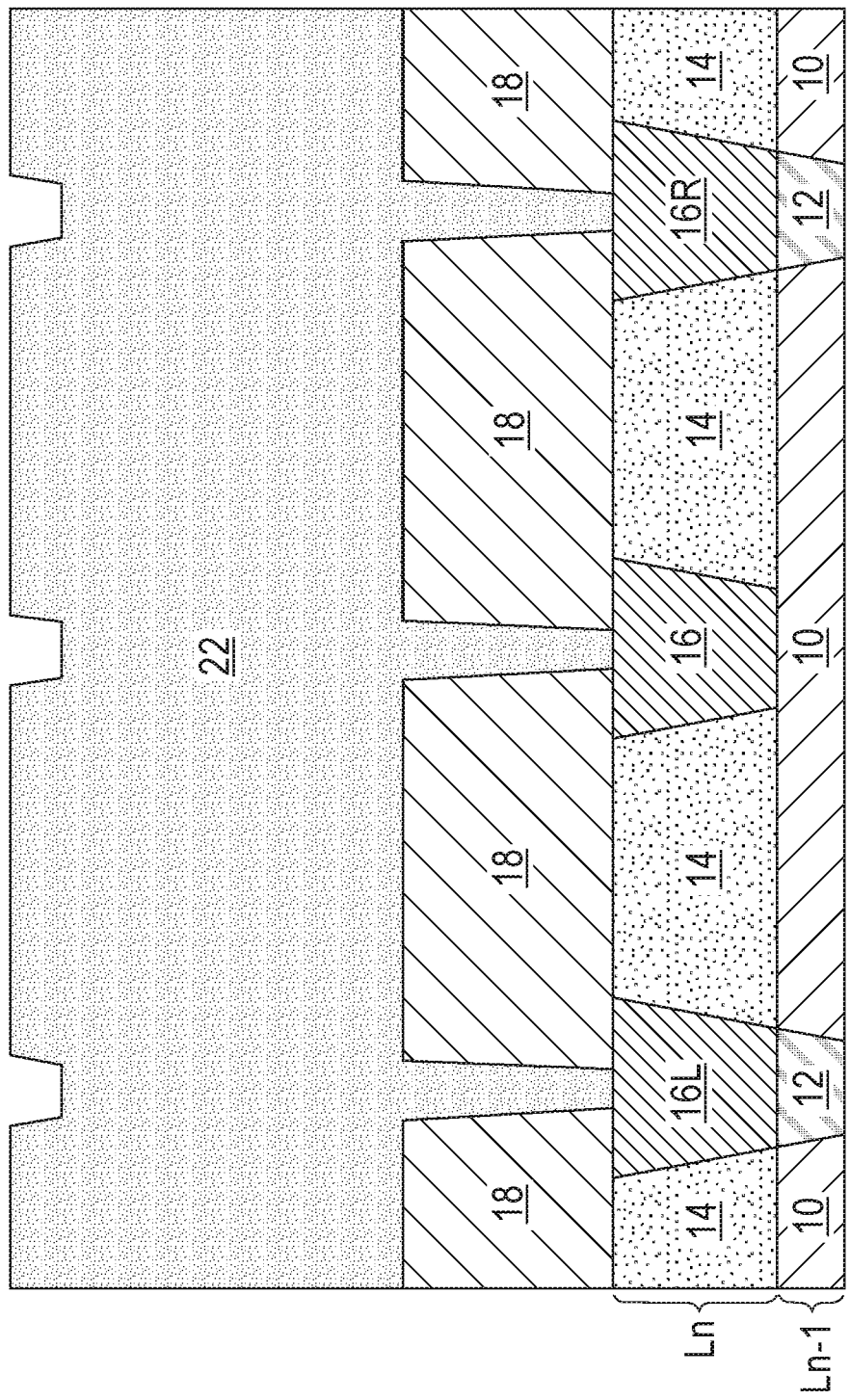
FIG. 3 is a cross sectional view of the exemplary structure of FIG. 2 after forming a bottom electrode metal-containing layer on the second interconnect dielectric material layer and within the at least one opening.

Referring now to FIG. 3, there is illustrated the exemplary structure of FIG. 2 after forming a bottom electrode metal-containing layer 22 on the second interconnect dielectric material layer 18 and within the at least one opening 20. In the illustrated embodiment, the bottom electrode metal-containing layer 22 completely fills in each opening 20 such that the bottom electrode metal-containing layer 22 within each opening 20 forms an interface with the physically exposed surface of the at least one CMOS device connected electrically conductive structure 16L, 16R, and, if present, the at least one isolated electrically conductive structure 16. The bottom electrode metal-containing layer 22 has a non-planarized upper surface.

The bottom electrode metal-containing layer 22 can be composed of a conductive material such as, for example, Ta, TaN, Ti, TiN, Ru, RuN, RuTa, RuTaN, Co, CoWP, CoN, W or WN. The bottom electrode metal-containing layer 22 has a thickness (i.e., vertical height) that is much greater (typically ≥1.5×) than the thickness of the second interconnect dielectric material layer 18. In one embodiment, the bottom electrode metal-containing layer 22 has a thickness from 200 nm to 300 nm. The bottom electrode metal-containing layer 22 can be formed by a conformal deposition process such as, for example, sputtering, chemical vapor deposition (CVD), or plasma enhanced chemical vapor deposition (PECVD).

Figure 4:
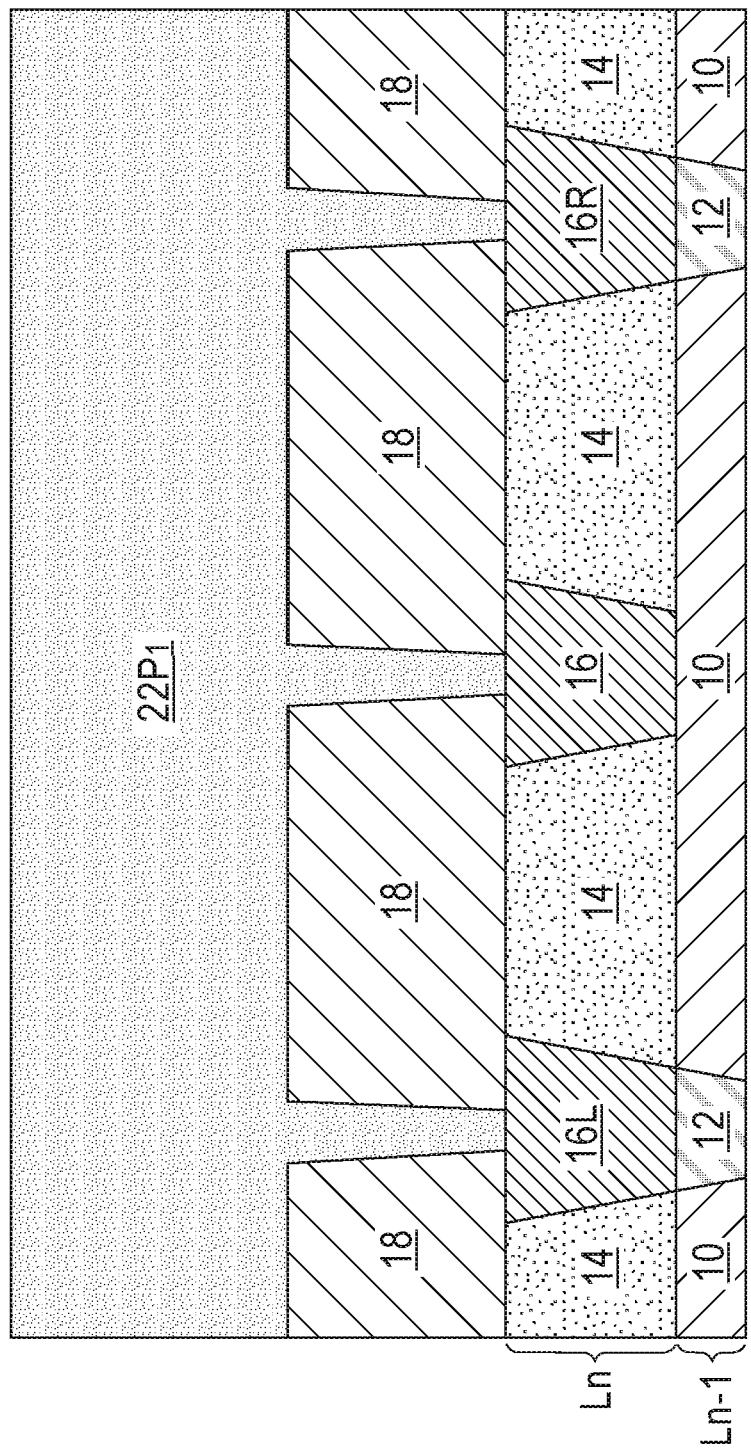
FIG. 4 is a cross sectional view of the exemplary structure of FIG. 3 after first planarizing the bottom electrode metal-containing layer.

Referring now to FIG. 4, there is illustrated the exemplary structure of FIG. 3 after first planarizing the bottom electrode metal-containing layer 22. The first planarizing, which may include chemical mechanical polishing (CMP) and/or grinding, removes an upper portion of the bottom electrode metal-containing layer 22, while maintaining a lower portion of the bottom electrode metal-containing layer 22. The maintained lower portion of the bottom electrode metal-containing layer 22 can be referred to as a once planarized bottom electrode metal-containing layer 22P$_1$.

The once planarized bottom electrode metal-containing layer 22P$_1$ has an entirely planar topmost surface that is located entirely above the topmost surface of the second interconnect dielectric material layer 18. The once planarized bottom electrode metal-containing layer 22P$_1$ has a thickness that is less than the thickness of the bottom electrode metal-containing layer 22.

Figure 5:
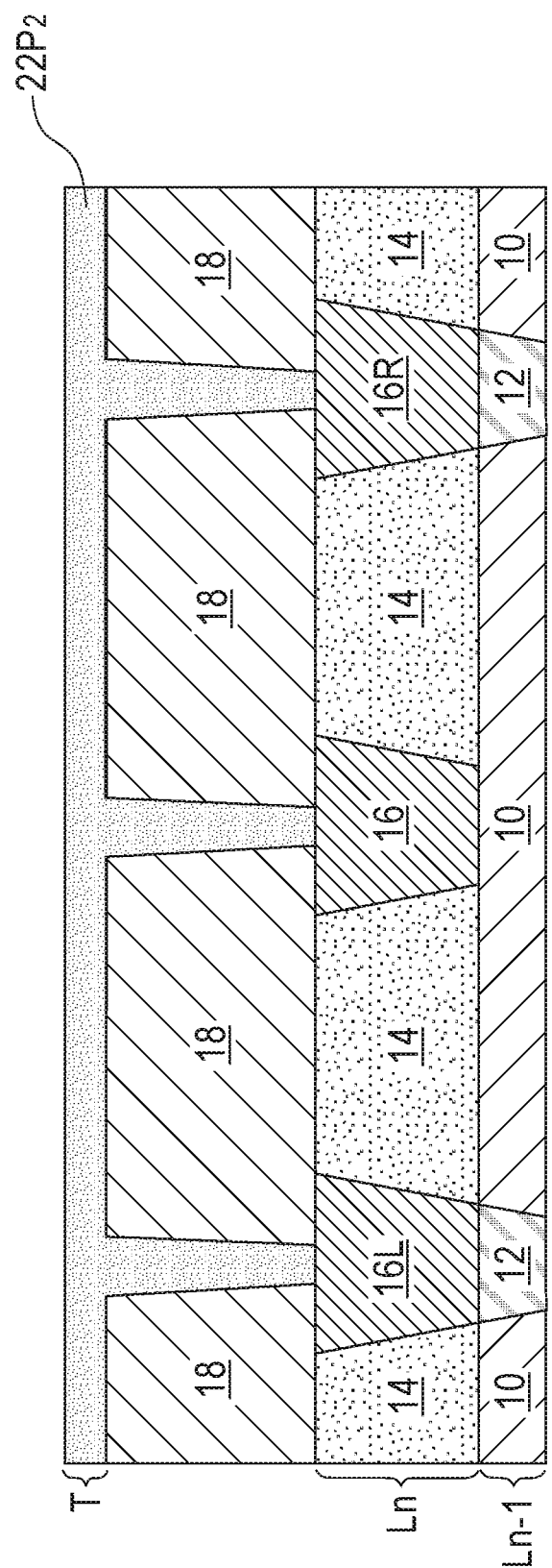
FIG. 5 is a cross sectional view of the exemplary structure of FIG. 4 after second planarizing the bottom electrode metal-containing layer.

Referring now to FIG. 5, there is illustrated the exemplary structure of FIG. 4 after second planarizing the bottom electrode metal-containing layer 22. The second planarizing, which may include CMP and/or grinding, removes an upper portion of the once planarized bottom electrode metal-containing layer 22P$_1$, while maintaining a lower portion of the once planarized bottom electrode metal-containing layer 22P$_1$. The maintained lower portion of the once planarized bottom electrode metal-containing layer 22P$_1$ can be referred to as a twice planarized bottom electrode metal-containing layer 22P$_2$.

The twice planarized bottom electrode metal-containing layer 22P$_2$ has an entirely planar topmost surface that is located entirely above the topmost surface of the second interconnect dielectric material layer 18. The twice planarized bottom electrode metal-containing layer 22P$_2$ has a thickness that is less than the thickness of the once planarized bottom electrode metal-containing layer 22P$_1$. In the present application, the twice planarized bottom electrode metal-containing layer 22P$_2$ has an upper portion that extends above the topmost surface of the second interconnect dielectric material layer 18. The upper portion of the twice planarized bottom electrode metal-containing layer 22P$_2$ that extends above the topmost surface of the second interconnect dielectric material layer 18 has a thickness, T, of from 5 nm to 40 nm. The thickness, T, of the upper portion of the twice planarized bottom electrode metal-containing layer 22P$_2$ that extends above the topmost surface of the second interconnect dielectric material layer 18 determines the thickness of a shelf portion of the T-shaped bottom electrode structure to be subsequently formed.

Figure 6:
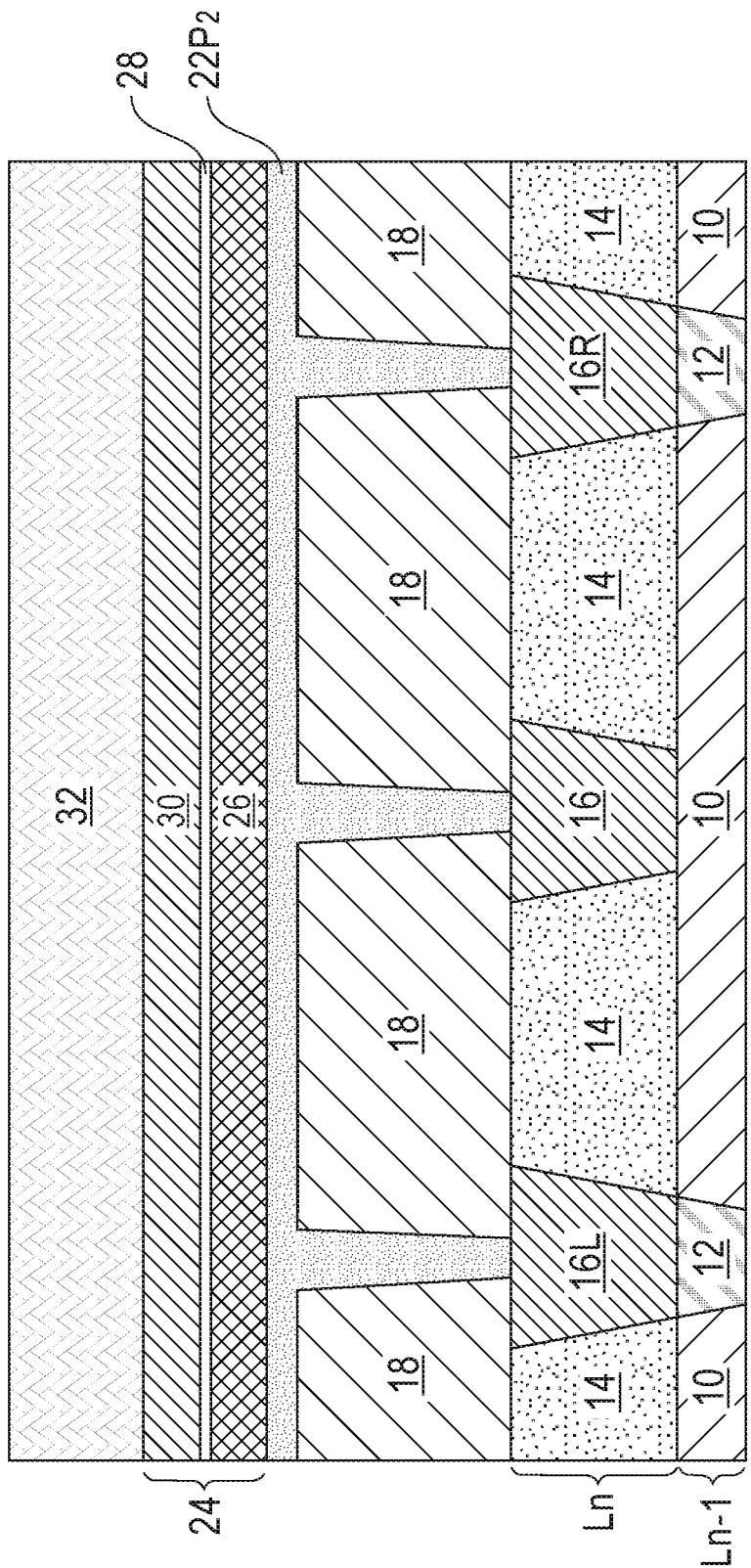
FIG. 6 is a cross sectional view of the exemplary structure of FIG. 5 after forming a multilayered magnetic tunnel junction (MTJ) material stack on the twice planarized bottom electrode metal-containing layer, and forming a top electrode metal-containing layer on the MTJ material stack.

Referring now to FIG. 6, there is illustrated the exemplary structure of FIG. 5 after forming a multilayered magnetic tunnel junction (MTJ) material stack 24 on the twice planarized bottom electrode metal-containing layer 22P$_2$, and forming a top electrode metal-containing layer 32 on the MTJ material stack 24.

The MTJ material stack 24 includes at least a magnetic pinned layer, a tunnel barrier layer, and a magnetic free layer. In some embodiments and as shown in FIG. 6, the MTJ material stack 24 is a bottom pinned MTJ material stack that includes, from bottom to top, a magnetic pinned layer 26, a tunnel barrier layer 28, and a magnetic free layer 30. An optional metal seed layer (not shown) can also be present in the bottom pinned MTJ material stack. In the bottom pinned MTJ material stack, the optional metal seed layer is formed beneath the magnetic pinned layer 26. The bottom pinned MTJ material stack can also include a non-magnetic spacer layer (not shown) located on the magnetic free layer 30, a second magnetic free layer (not shown) located on the non-magnetic spacer layer, and/or a MTJ cap layer (not shown) located on the magnetic free layer 30 or on the second magnetic free layer.

In other embodiments (not shown), the MTJ material stack 24 is a top pinned MTJ material stack that includes, from bottom to top, a magnetic free layer, a tunnel barrier layer, and a magnetic pinned layer; in this embodiment, the order of elements 26 and 30 are reversed from those shown in FIG. 6. In such an embodiment, the top pinned MTJ material stack can also include an optional metal seed layer located beneath the magnetic free layer, a non-magnetic spacer layer located on the magnetic free layer, a second magnetic free layer located on the non-magnetic spacer layer, and/or a MTJ cap layer located on the magnetic pinned layer.

The various material layers of the MTJ material stack 24 can be formed by utilizing one or more deposition processes such as, for example, sputtering, plasma enhanced atomic layer deposition (PEALD), plasma enhanced chemical vapor deposition (PECVD) or physical vapor deposition (PVD).

The optional metal seed layer can be composed of platinum (Pt), palladium (Pd), nickel (Ni), rhodium (Rh), iridium (Jr), rhenium (Re) or alloys and multilayers thereof. In one example, the optional metal seed layer is composed of platinum (Pt).

The magnetic pinned layer 26 has a fixed magnetization. The magnetic pinned layer 26 can be composed of a metal or metal alloy (or a stack thereof) that includes one or more metals exhibiting high spin polarization. In alternative embodiments, exemplary metals for the formation of the magnetic pinned layer 26 include iron, nickel, cobalt, chromium, boron, or manganese. Exemplary metal alloys can include the metals exemplified by the above. In another embodiment, the magnetic pinned layer 26 can be a multi-layer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the magnetic pinned layer 26.

The tunnel barrier layer 28 is composed of an insulator material and is formed at such a thickness as to provide an appropriate tunneling resistance. Exemplary materials for the tunnel barrier layer 28 include magnesium oxide, aluminum oxide, and titanium oxide, or materials of higher electrical tunnel conductance, such as semiconductors or low-bandgap insulators.

The magnetic free layer 30 can be composed of a magnetic material (or a stack of magnetic materials) with a magnetization that can be changed in orientation relative to the magnetization orientation of the magnetic pinned layer 26. Exemplary magnetic materials for the magnetic free layer 30 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer can include one of the magnetic materials mentioned above for magnetic free layer 30. In one embodiment, the second magnetic free layer is composed of a same magnetic material as the magnetic free layer 30. In another embodiment, the second magnetic free layer is composed of a magnetic material that is compositionally different from the magnetic free layer 30.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer can have a thickness from 2 nm to 25 nm; other thicknesses are possible and can be used in the present application as the thickness of the MTJ cap layer.

The top electrode metal-containing layer 32 can be composed of a conductive material such as, for example, Ta, TaN, Ti, TiN, Ru, RuN, RuTa, RuTaN, Co, CoWP, CoN, W, WN or any combination thereof. In one embodiment of the present application, top electrode metal-containing layer 32 is composed of Ti/TiN. The conductive material that provides the top electrode metal-containing layer 32 can be compositionally the same as, or compositionally different from, the conductive material that provides the bottom electrode metal-containing layer 22.

In the present application, the top electrode metal-containing layer 32 can have a thickness that is from 100 nm to 500 nm; although other thicknesses are possible and can be used as the thickness of the top electrode metal-containing layer 32. The top electrode metal-containing layer 32 can be formed by a deposition process such as, for example, sputtering, plasma enhanced atomic layer deposition (PEALD), plasma enhanced chemical vapor deposition (PECVD) or physical vapor deposition (PVD).

Figure 7:
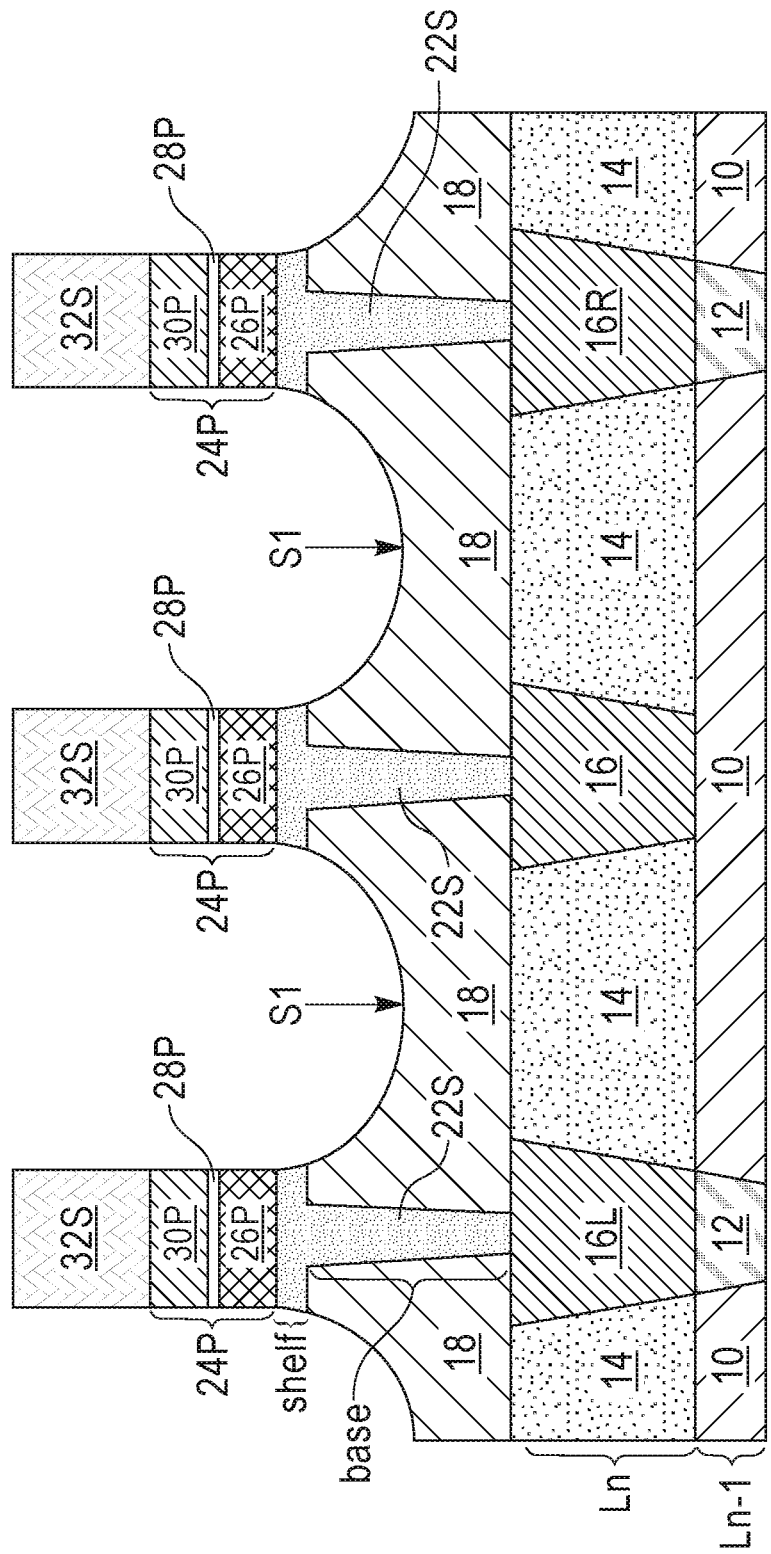
FIG. 7 is a cross sectional view of the exemplary structure of FIG. 6 after patterning the top electrode metal-containing layer, the MTJ material stack and the twice planarized bottom electrode metal-containing layer to provide a top electrode structure, a MTJ pillar, and a T-shaped bottom electrode structure, respectively.

Referring now to FIG. 7, there is illustrated the exemplary structure of FIG. 6 after patterning the top electrode metal-containing layer 32, the MTJ material stack 24 and the twice planarized bottom electrode metal-containing layer 22P$_2$ to provide a top electrode structure 32S, a MTJ pillar 24P, and a T-shaped bottom electrode structure 22S, respectively.

The patterning of the top electrode metal-containing layer 32, the MTJ material stack 24 and the twice planarized bottom electrode metal-containing layer 22P$_2$ can include first forming a patterned mask (not shown) on a physically exposed surface of the top electrode metal-containing layer 32. In some embodiments, the patterned mask can be composed of a photolithographic resist stack. In one embodiment, the photolithographic resist stack that provides the patterned mask can include a bottom organic layer, a middle inorganic layer and a top resist layer. The bottom organic layer of the photolithographic resist stack can include an organic planarization layer (OPL). The bottom organic layer of the photolithographic resist stack can include a spun-on organic layer such as, for example, a Near Frictionless Carbon (NFC), a diamond-like carbon, a thermosetting polyarylene ether or polyimide. The middle inorganic layer of the photolithographic resist stack can include any oxide layer such as, for example, a low temperature (e.g., less than or equal to 250° C.) CVD oxide, an oxide derived from TEOS (tetraethylorthosilicate), a silicon oxide, a silane oxide, or a Si-containing anti-reflection coating material (SiARC). The top resist layer of the photolithographic resist stack can be composed of a resist material that provides for high resolution lithography patterning. The photolithographic resist stack can be formed be first providing a utilizing a series of deposition processes including first spin-on coating of the bottom organic layer, second spin-on coating of the middle inorganic layer, and third spin-on coating of the top resist layer. After providing the photolithographic resist stack, the top resist layer is patterned by photolithography (i.e., exposing the top resist layer to a pattern of irradiation and then developing the exposed top resist layer), and thereafter the pattern provided to the top resist layer is transferred into the underlying layers of the photolithographic resist stack providing patterned mask. The transferring can include one or more etching processes.

In some embodiments, patterning can include first patterning the top electrode metal-containing layer 32 utilizing a first etching process such as, for example, a reactive ion etch, utilizing the patterned mask as an etch mask. The remaining, i.e., non-patterned, portion of the top electrode metal-containing layer 32 provides the top electrode structure 32S. The top electrode structure 32S can be cylindrical in shape; although other asymmetric shapes are possible and can be used in the present application as the shape of the top electrode structure 32S. The critical dimension (CD) of the top electrode structure 32S can vary and is not critical in the present application.

After patterning the top electrode metal-containing layer 32, the patterned mask is removed from atop the top electrode structure 32S that is formed utilizing conventional processes well-known to those skilled in the art. The patterning of the MTJ material stack 24 and the twice planarized bottom electrode metal-containing layer 22P$_2$ is then performed utilizing an ion beam etch (IBE) in which the top electrode structure 32S is employed as a patterned mask. The remaining, i.e., non-patterned, portion of the MTJ material stack 24 provides the MTJ pillar 24P. In one example and as shown in FIG. 7, the MTJ pillar 24P includes, from bottom to top, a magnetic pinned material layer portion 26P (i.e., a remaining, unetched portion of the magnetic pinned material layer 26), a tunnel barrier layer portion 28P (i.e., a remaining, unetched portion of the tunnel barrier layer 28), and a magnetic free layer portion 30P (i.e., a remaining, unetched portion of the magnetic free layer 30). In another example (not shown), the MTJ pillar 24P includes, from bottom to top, a magnetic free layer portion 30P, a tunnel barrier layer portion 28P, and a magnetic pinned material layer portion 26P. The MTJ pillar 24P can include remaining portions of any other layer that is present in the MTJ material stack 24. The MTJ pillar 24P can be cylindrical in shape; although other asymmetric shapes are possible and can be used in the present application as the shape of the MTJ pillar 24P; the MTJ pillar 24P and the top electrode structure 32S have a same shape. The critical dimension (CD) of the MTJ pillar 24P can vary and is not critical in the present application. The CD of the MTJ pillar 24P is typically the same as the CD of the top electrode structure 32S.

IBE etching continues to pattern the underlying twice planarized bottom electrode metal-containing layer 22P$_2$ to provide a T-shaped bottom electrode structure 22S. During the IBE, a physically exposed upper portion of the second interconnect dielectric material 18 can also be removed, as shown in FIG. 7. After the IBE, the remaining second interconnect dielectric material can have a concave surface, S1, as shown in FIG. 7.

Each T-shaped bottom electrode structure 22S includes a remaining portion of the twice planarized bottom electrode metal-containing layer 22P$_2$. Each T-shaped bottom electrode structure 22S includes a base (i.e., vertical extending) portion (labeled as 'base' in FIG. 7) and a shelf (i.e., horizontal) portion (labeled as 'shelf' in FIG. 7). The T-shaped bottom electrode structure 22S is of uniform construction (i.e., a single piece) lacking any material interface between the shelf portion and the base portion. The shelf portion has outermost edges that extend beyond the outermost edges of the base portion. In some embodiments (and as shown in FIG. 7), the outermost edges of the shelf portion of the T-shaped bottom electrode structure 22S tapers outward from a topmost surface of the shelf portion to the bottommost surface of the shelf portion. The base portion of each T-shaped bottom electrode structure 22S has a width that is less than the shelf portion. The base portion and shelf portion of each T-shaped bottom electrode structure 22S are of unitary construction (i.e., a single piece) that is composed of a same bottom electrode material. The shelf portion of each T-shaped bottom electrode structure 22S provides a planar surface in which the MTJ pillar 24P forms an interface with. Thus, variation in height uniformity of the MTJ pillars is avoided.

Collectively, the T-shaped bottom electrode structure 22S, the MTJ pillar 24P, and the top electrode structure 32S provide a memory structure in accordance with the present application. The presence of the T-shaped bottom electrode structure 22S in the memory structures short circuits the CMOS device connected electrically conductive structure 16L, 16R as well as the isolated electrically conductive structure 16. Thus, and due to presence of the T-shaped bottom electrode structure 22S, high resistance, due to the galvanic effect mentioned, above is reduced and/or even eliminated. Also, and due to presence of the T-shaped bottom electrode structure 22S array yield loss is not observed.

Figure 8:
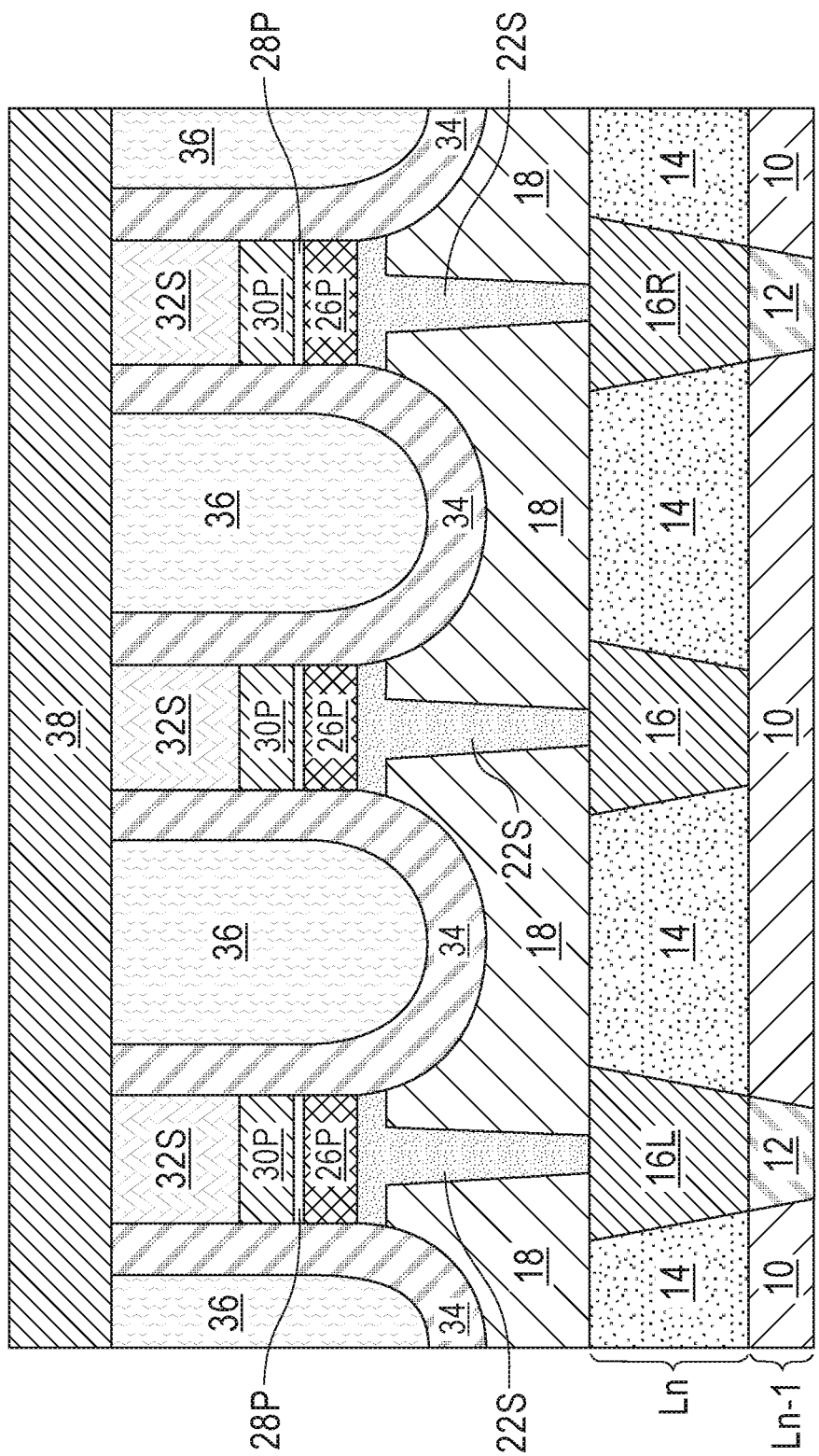
FIG. 8 is a cross sectional view of the exemplary structure of FIG. 7 after forming an encapsulation liner, a third interconnect dielectric material layer, and a bitline contact.

Referring now to FIG. 8, there is illustrated the exemplary structure of FIG. 7 after forming an encapsulation liner 34, a third interconnect dielectric material layer 36, and a bitline contact 38. The encapsulation liner 34 laterally surrounds the top electrode structure 32S, the MTJ pillar 24P and the shelf portion of the T-shaped bottom electrode 22S. The third interconnect dielectric material layer 36 is located on the encapsulation liner 34 and fills in the gaps that are located between neighboring memory structures. The bitline contact 38 is located above each memory structure and the third interconnect dielectric material layer 36. In the illustrated embodiment, the bitline contact 38 has a surface that contacts a surface of each top electrode structure 32S.

The encapsulation liner 34 can be present on the concave surface, Si, of the second interconnect dielectric material layer 18. The encapsulation liner 34 is composed of a dielectric material that is compositionally different from the second interconnect dielectric material layer 18. The dielectric material that provides the encapsulation liner 34 may provide passivation to the top electrode structure 32S, the MTJ pillar 24P, and the shelf portion of the T-shaped bottom electrode 22S. In one embodiment, the encapsulation liner 34 is composed of silicon nitride. In another embodiment, the encapsulation liner 34 can be composed of a dielectric material that contains atoms of silicon, carbon and hydrogen. In some embodiments, and in addition to atoms of carbon and hydrogen, the dielectric material that provides the encapsulation liner 34 can include atoms of at least one of nitrogen and oxygen. In other embodiments, and in addition to atoms of silicon, nitrogen, carbon and hydrogen, the dielectric material that provides the encapsulation liner 34 can include atoms of boron. In one example, the encapsulation liner 34 can be composed of an nBLOK dielectric material that contains atoms of silicon, carbon, hydrogen, nitrogen and oxygen. In alternative example, the encapsulation liner 34 can be composed of a SiBCN dielectric material that contains atoms of silicon, boron, carbon, hydrogen, and nitrogen.

The encapsulation liner 34 can be formed by first deposition a continuous layer of the dielectric material that provides the encapsulation liner 34. During a subsequently performed planarization process that is used in forming the third interconnect dielectric material layer 36, the dielectric material that provides the encapsulation liner 34 is removed from a topmost surface of each of the top electrode structures 32S. The encapsulation liner 34 can have a thickness from 10 nm to 200 nm. Other thicknesses are possible and can be employed as the thickness of the encapsulation liner 34. The encapsulation liner 34 typically has a topmost surface that is coplanar with a topmost surface of the top electrode structure 32S.

The third interconnect dielectric material layer 36 can include one of the interconnect dielectric materials mentioned above. The interconnect dielectric material that provides the third interconnect dielectric material layer 36 can be compositionally the same as, or compositionally different from, the interconnect dielectric material that provides the first interconnect dielectric material layer 14 and/or the second interconnect dielectric material layer 18. The third interconnect dielectric material layer 36 can be formed utilizing a conventional deposition process including, for example, chemical vapor deposition (CVD), plasma enhanced chemical vapor deposition (PECVD) or spin-on coating. A planarization process such as, for example, chemical mechanical polishing (CMP), can follow the deposition of the interconnect dielectric material that provides the third interconnect dielectric material layer 36; as mentioned above this planarization steps also removes the dielectric material that provides the encapsulation liner 34 from the topmost surface of the top electrode structure 32S.

Bitline contact 38 can include one of the electrically conductive metals or metal alloys mentioned above. The bitline contact 36 can be formed by deposition of a layer of an electrically conductive metal or metal alloy, followed by patterning the layer of electrically conductive metal or metal alloy. Patterning can be performed by lithography and etching, as defined above.

Figure 9:
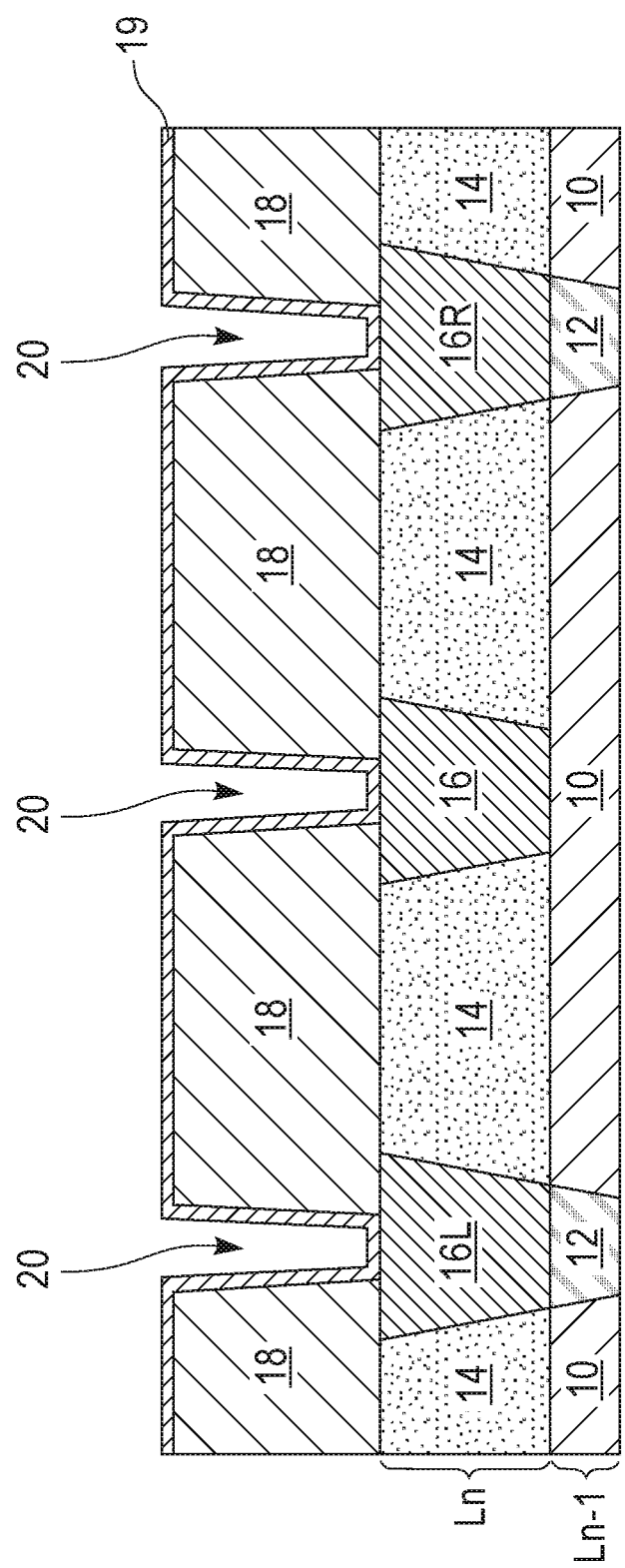
FIG. 9 is a cross sectional view of the exemplary structure of FIG. 2 after forming a diffusion barrier material layer on the second interconnect dielectric material layer and lining the at least one opening.

Referring now to FIG. 9, there is illustrated the exemplary structure of FIG. 2 after forming a diffusion barrier material layer 19 on the second interconnect dielectric material layer 18 and lining the at least one opening 20. The diffusion barrier material layer 19 is a continuous layer that is composed of a diffusion barrier material (i.e., a material that serves as a barrier to prevent a conductive material such as copper from diffusing there through). Examples of diffusion barrier materials that can be used in providing the diffusion barrier material layer 19 include, but are not limited to, Ta, TaN, Ti, TiN, Ru, RuN, RuTa, RuTaN, W, or WN. In some embodiments, the diffusion barrier material layer 19 can include a material stack of diffusion barrier materials. In one example, the diffusion barrier material layer 19 can be composed of a stack of Ta/TaN.

The diffusion barrier material layer 19 can be formed utilizing a deposition process such as, for example, chemical vapor deposition (CVD), plasma enhanced chemical vapor deposition (PECVD), atomic layer deposition (ALD) or physical vapor deposition (PVD). The diffusion barrier material layer 19 can have a thickness from 1 nm to 20 nm. Other thicknesses for the diffusion barrier material layer 19 are contemplated and can be used as long as the thickness of the diffusion barrier material layer 19 does not completely fill in the at least one opening 20.

Figure 10:
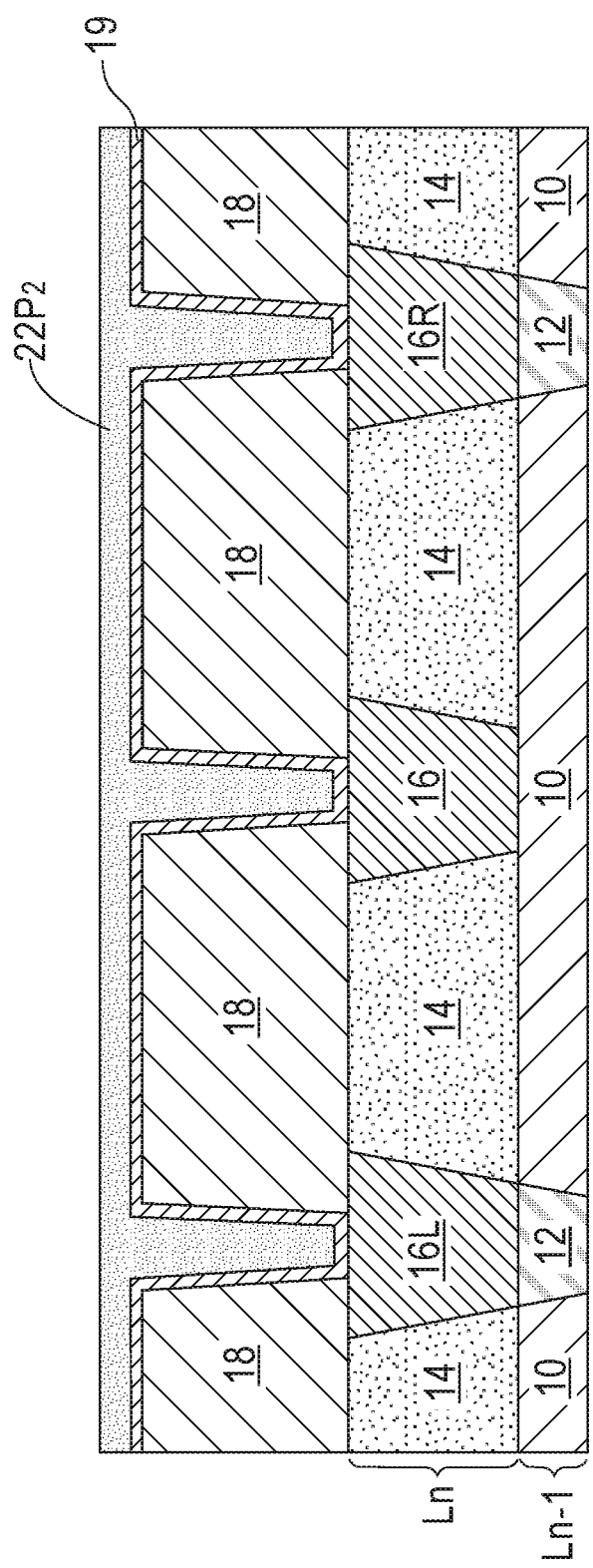
FIG. 10 is a cross sectional view of the exemplary structure of FIG. 9 after forming a bottom electrode metal-containing layer on the diffusion barrier material layer, first planarizing the bottom electrode metal-containing layer, and second planarizing the bottom electrode metal-containing layer.

Referring now to FIG. 10, there is illustrated the exemplary structure of FIG. 9 after forming a bottom electrode metal-containing layer (not shown, but described above in FIG. 3) on the diffusion barrier material layer 19, first planarizing the bottom electrode metal-containing layer (as described above in FIG. 4), and second planarizing (as described in FIG. 5 above) the bottom electrode metal-containing layer to provide a twice planarized bottom electrode metal-containing layer $22P_2$. The first and second planarizing may include sequential CMP and/or grinding steps. The twice planarized bottom electrode metal-containing layer $22P_2$ has an entirely planar topmost surface that is located above the topmost surface of the second interconnect dielectric material layer 18. The twice planarized bottom electrode metal-containing layer $22P_2$ has a thickness T as described above in FIG. 5.

Figure 11:
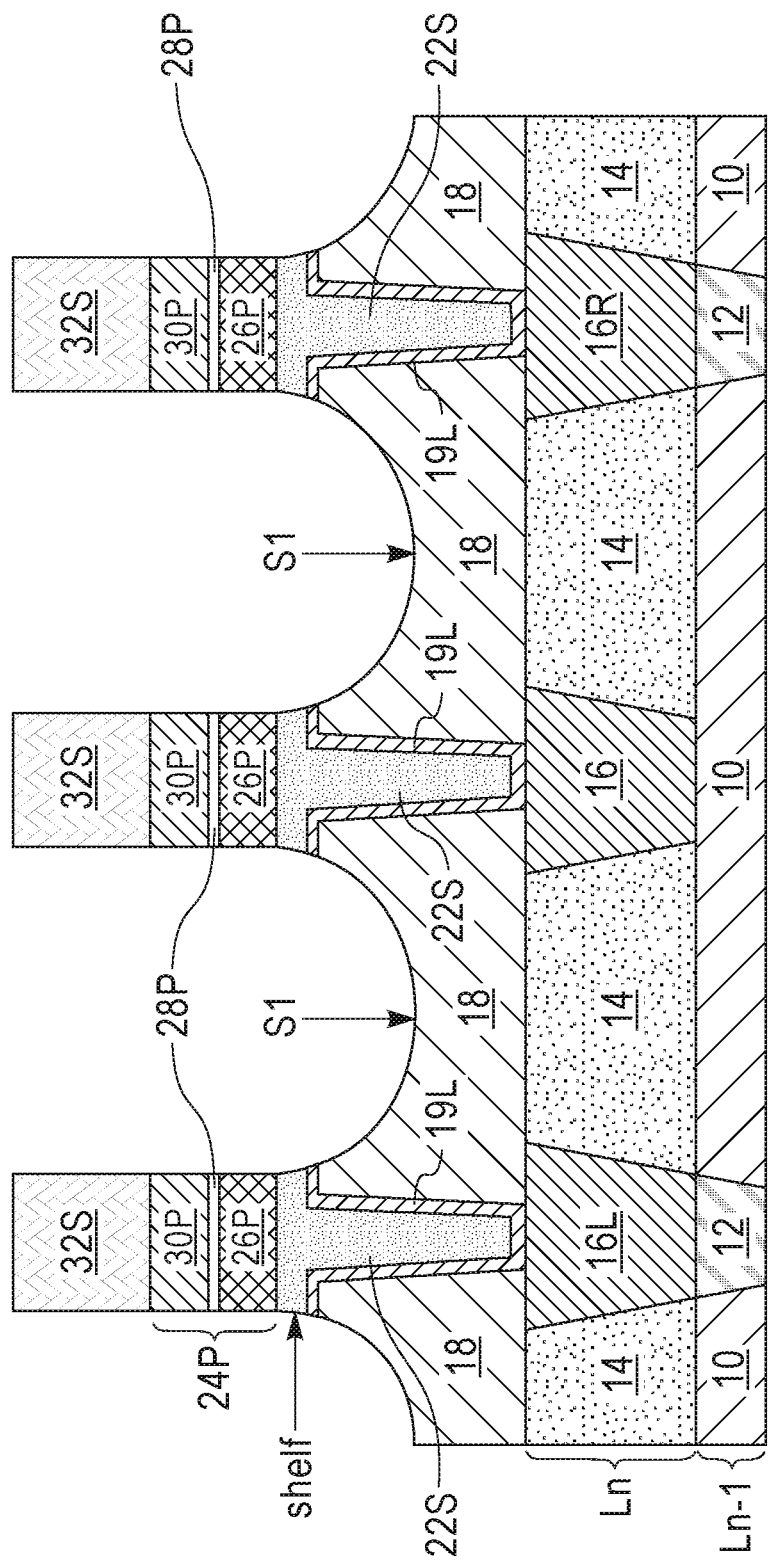
FIG. 11 is a cross sectional view of the exemplary structure of FIG. 10 after forming a multilayered magnetic tunnel junction (MTJ) material stack on the twice planarized bottom electrode metal-containing layer, forming a top electrode metal-containing layer on the MTJ material stack, and patterning the top electrode metal-containing layer, the MTJ material stack, the twice planarized bottom electrode metal-containing layer and the diffusion barrier material layer to provide a top electrode structure, a MTJ pillar, a T-shaped bottom electrode structure, and a diffusion barrier liner, respectively.

Referring now to FIG. 11, there is illustrated the exemplary structure of FIG. 10 after forming a multilayered magnetic tunnel junction (MTJ) material stack on the twice planarized bottom electrode metal-containing layer $22P_2$, forming a top electrode metal-containing layer on the MTJ material stack, and patterning the top electrode metal-containing layer, the MTJ material stack, the twice planarized bottom electrode metal-containing layer and the diffusion barrier material layer to provide a top electrode structure 32A, a MTJ pillar 24P, a T-shaped bottom electrode structure 22S, and a diffusion barrier liner 19L, respectively.

The exemplary structure shown in FIG. 11 can be formed utilizing the basic processing steps and materials mentioned above in forming the exemplary structures shown in FIGS. 6 and 7. In this embodiment, and as shown in FIG. 11, the diffusion barrier liner 19L is located beneath the shelf portion of the T-shaped bottom electrode structure 22S and lines the entirety of the at least one opening 20. Thus, the diffusion barrier liner 19 is located between the T-shaped bottom electrode structure 22S and the second interconnect dielectric material layer 18 and between a bottommost surface of the T-shaped bottom electrode structure 22S and one of the electrically conductive structures 16L, 16R, 16 that are embedded in the first interconnect dielectric material layer 14.

Figure 12:
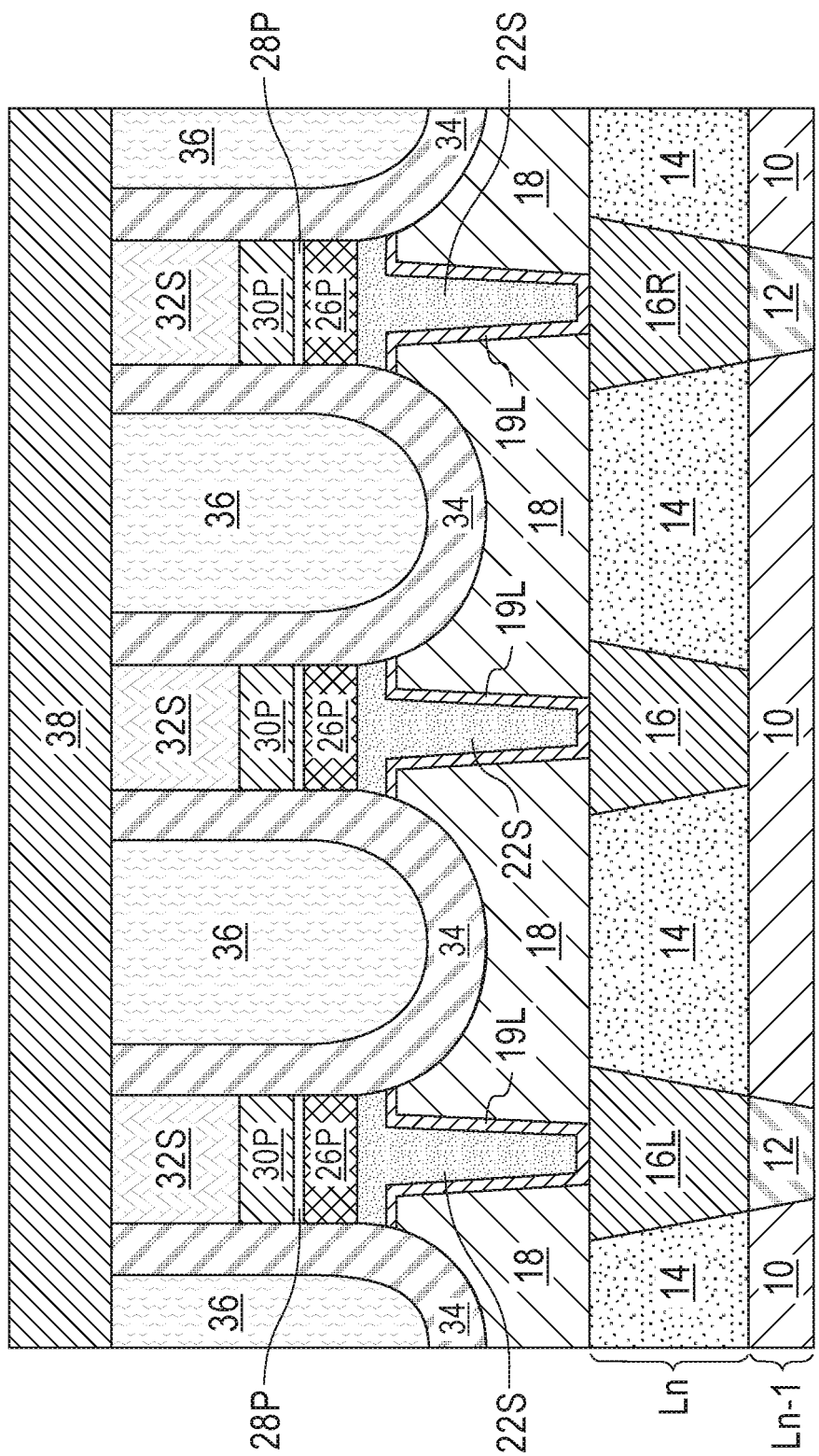
FIG. 12 is a cross sectional view of the exemplary structure of FIG. 11 after forming an encapsulation liner, a third interconnect dielectric material layer, and a bitline contact.

Referring now to FIG. 12, there is illustrated the exemplary structure of FIG. 11 after forming an encapsulation liner 34, a third interconnect dielectric material layer 36, and a bitline contact 38. The encapsulation liner 34, the third interconnect dielectric material layer 36, and the bitline contact 38 used in this embodiment of the present application are identical to the encapsulation liner 34, the third interconnect dielectric material layer 36, and the bitline contact 38 used in providing the exemplary structure shown in FIG. 8.

Figure 13:
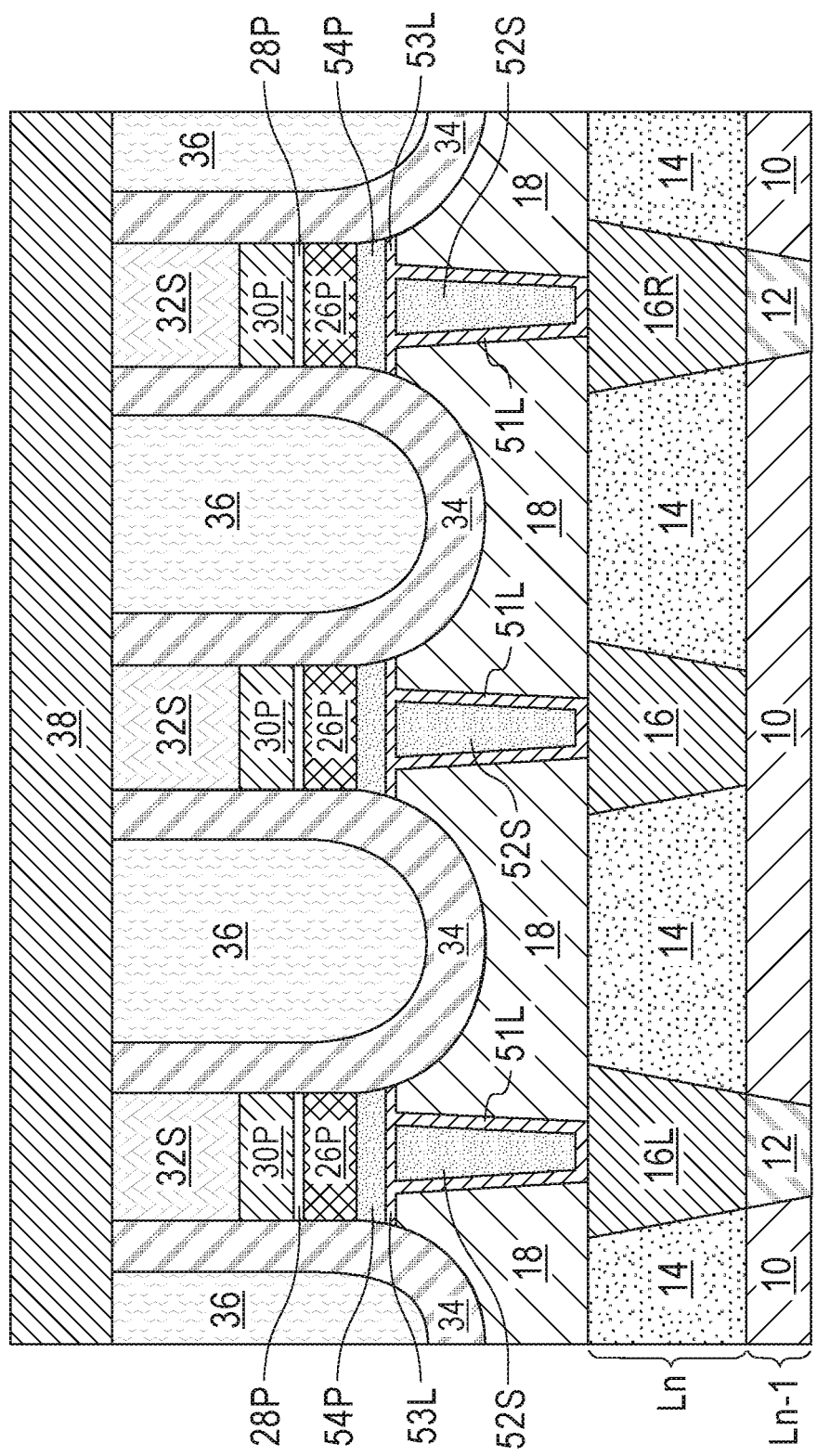
FIG. 13 is a cross sectional view of a prior art memory structure.

Referring now to FIG. 13, there is illustrated a prior art memory structure. The prior art memory structure differs from the memory structures of the present application in that a diffusion barrier liner 53L is located between a bottom electrode pillar 52S and a planar landing pad structure 54P. The bottom electrode pillar 52S and the planar landing pad structure 54P are both composed of a metal or metal alloy that is prone to oxidation and/or corrosion. Thus, the prior art structure may exhibit high resistance and low array yield.

It is noted that no solid T-shaped bottom electrode structure 22S of uniform construction (i.e., a single piece) is present in the prior art structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
   a T-shaped bottom electrode structure of uniform construction located on a surface of a complementary metal oxide semiconductor (CMOS) device connected electrically conductive structure that is embedded in a first interconnect dielectric material layer;
   a second interconnect dielectric material layer laterally surrounding a lower portion of the T-shaped bottom electrode structure and located above the first interconnect dielectric material layer, wherein the second interconnect dielectric material layer has a concave surface;
   a multilayered magnetic tunnel junction (MTJ) pillar located on the T-shaped bottom electrode structure, and
   a top electrode structure located on the MTJ pillar.

2. The memory structure of claim 1, wherein the MTJ pillar comprises a bottom pinned MTJ material structure.

3. The memory structure of claim 1, wherein the MTJ pillar comprises a top pinned MTJ material structure.

4. The memory structure of claim 1, wherein the T-shaped bottom electrode structure comprises a base portion and a shelf portion, the shelf portion has a width that is greater than a width of the base portion.

5. The memory structure of claim 4, wherein the second interconnect dielectric material layer laterally surrounds only the base portion of the T-shaped bottom electrode structure.

6. The memory structure of claim 5, further comprising a diffusion barrier liner located directly beneath the shelf portion of T-shaped bottom electrode structure, and lining the sidewalls and bottom wall of the base portion of the T-shaped bottom electrode structure.

7. The memory structure of claim 5, further comprising an encapsulation liner and a third interconnect dielectric material layer located laterally adjacent to the shelf portion of the T-shaped bottom electrode structure, the MTJ pillar and the top electrode structure.

8. The memory structure of claim 7, further comprising a bitline contact located on the third interconnect dielectric material layer and contacting a surface of the top electrode structure.

9. A structure comprising:
   a first memory cell comprising a first T-shaped bottom electrode structure of uniform construction located on a surface of a complementary metal oxide semiconductor (CMOS) device connected electrically conductive structure that is embedded in a first interconnect dielectric material layer, a first multilayered magnetic tunnel junction (MTJ) pillar located on the first T-shaped bottom electrode structure, and a first top electrode structure located on the first MTJ pillar;
   a second memory cell located laterally adjacent to the first memory cell and comprising a second T-shaped bottom electrode structure of uniform construction located on a surface of an isolated electrically conductive structure that is embedded in the first interconnect dielectric material layer, a second MTJ pillar located on the second T-shaped bottom electrode structure, and a second top electrode structure located on the second MTJ pillar; and
   a second interconnect dielectric material layer laterally surrounding a lower portion of both the first and second T-shaped bottom electrode structures and located above the first interconnect dielectric material layer, wherein the second interconnect dielectric material layer has a concave surface.

10. The structure of claim 9, wherein the first MTJ pillar and the second MTJ pillar comprise a bottom pinned MTJ material structure.

11. The structure of claim 9, wherein the first MTJ pillar and the second MTJ pillar comprise a top pinned MTJ material structure.

12. The structure of claim 9, wherein the first T-shaped bottom electrode structure and the second T-shaped bottom electrode structure comprise a base portion and a shelf portion, the shelf portion has a width that is greater than a width of the base portion.

13. The structure of claim 12, wherein the second interconnect dielectric material layer laterally surrounds only the base portion of each of the first T-shaped bottom electrode structure and the second T-shaped bottom electrode structure.

14. The structure of claim 13, further comprising a diffusion barrier liner located directly beneath the shelf portion of each of the first T-shaped bottom electrode structure and the second T-shaped bottom electrode structure, and lining the sidewalls and bottom wall of the base portion of each of first T-shaped bottom electrode structure and the second T-shaped bottom electrode structure.

15. The structure of claim 14, further comprising an encapsulation liner and a third interconnect dielectric material layer located laterally adjacent to the shelf portion of each of the first T-shaped bottom electrode structure and the second T-shaped bottom electrode structure, each of the first MTJ pillar and the second MTJ pillar, and each of the first top electrode structure and the second top electrode structure.

16. The structure of claim 15, further comprising a bitline contact located on the third interconnect dielectric material layer and contacting a surface of the first top electrode structure and the second top electrode structure.

17. A method of forming a memory structure, the method comprising:
   forming a second interconnect dielectric material layer on an interconnect level including at least one CMOS device connected electrically conductive structure embedded in a first interconnect dielectric material layer;
   forming at least one opening into the second interconnect dielectric material layer, wherein the at least one opening physically exposes a surface of the at least one CMOS device connected electrically conductive structure;
   forming a bottom electrode metal-containing layer on the second interconnect dielectric material layer and within the at least one opening;
   first and second planarizing the bottom electrode metal-containing layer to provide a twice planarized bottom electrode metal-containing layer;
   forming a multilayered magnetic tunnel junction (MTJ) material stack on the twice planarized bottom electrode metal-containing layer, and a top electrode metal-containing layer on the MTJ material stack; and patterning the top electrode metal-containing layer, the MTJ material stack and the twice planarized bottom electrode metal-containing layer to provide a top electrode structure, a MTJ pillar, and a T-shaped bottom electrode structure, respectively, wherein the patterning removes an upper portion of the second interconnect dielectric material layer to provide a concave surface to the second interconnect dielectric material layer.

18. The method of claim 17, wherein the MTJ material stack comprises a bottom pinned MTJ material stack.

19. The method of claim 17, wherein the MTJ material stack comprises a top pinned MTJ material stack.

20. The method of claim 17, wherein the T-shaped bottom electrode structure comprises a base portion and a shelf portion, the shelf portion has a width that is greater than a width of the base portion.

21. The method of claim 17, further comprising forming, after the patterning, an encapsulation liner, a third interconnect dielectric material layer, and a bitline contact.

22. The method of claim 17, further comprising forming, prior to forming the bottom electrode metal-containing layer, a diffusion barrier material layer on the second interconnect dielectric material layer and lining the at least one opening.

23. The method of claim 22, wherein the patterning also provides a diffusion barrier liner located beneath the T-shaped bottom electrode structure.

24. The method of claim 23, further comprising forming, after the patterning, an encapsulation liner, a third interconnect dielectric material layer, and a bitline contact.

* * * * *